(12) United States Patent
Burnham et al.

(10) Patent No.: US 10,499,498 B2
(45) Date of Patent: *Dec. 3, 2019

(54) SYSTEMS AND METHODS FOR PROVIDING SURFACE CONNECTIVITY OF ORIENTED CONDUCTIVE CHANNELS

(71) Applicant: FLEXcon Company, Inc., Spencer, MA (US)

(72) Inventors: Kenneth Burnham, Warren, MA (US); Richard Skov, Spencer, MA (US); Stephen Tomas, Fiskdale, MA (US); Jimmy Nguyen, Lowell, MA (US); Stephen M. Pizzo, Brookline, MA (US); Lisa Crislip, Worcester, MA (US)

(73) Assignee: FLEXcon Company, Inc., Spencer, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/714,664

(22) Filed: Sep. 25, 2017

(65) Prior Publication Data

US 2018/0042108 A1 Feb. 8, 2018

Related U.S. Application Data

(63) Continuation of application No. 14/209,213, filed on Mar. 13, 2014, now Pat. No. 9,775,235, which is a
(Continued)

(51) Int. Cl.
*H01B 1/20* (2006.01)
*C25D 13/00* (2006.01)
(Continued)

(52) U.S. Cl.
CPC .............. *H05K 1/0296* (2013.01); *C09J 9/02* (2013.01); *C25D 13/00* (2013.01); *H01B 1/20* (2013.01); *H01B 1/22* (2013.01); *H01B 1/24* (2013.01)

(58) Field of Classification Search
CPC ... H01B 1/00; H01B 1/20; H01B 1/22; H01B 1/24; C25D 13/00; H05K 1/0296
See application file for complete search history.

(56) References Cited

U.S. PATENT DOCUMENTS 4,731,282 A * 3/1988 Tsukagoshi ....... H01L 23/49883
257/E23.075
5,082,595 A 1/1992 Glackin
(Continued)

FOREIGN PATENT DOCUMENTS

CN 101953026 A 1/2011
CN 101238189 B 12/2012
(Continued)

OTHER PUBLICATIONS

Office Action issued by the State Intellectual Property Office (SIPO) in related Chinese Patent Application No. 201480003209.1 dated Dec. 26, 2017.
(Continued)

*Primary Examiner* — Mark Kopec
(74) *Attorney, Agent, or Firm* — Gesmer Updegrove LLP

(57) ABSTRACT

An electrically conductive composite is disclosed that includes a dielectric material having a first side and a second side, conductive particles within the dielectric material layer, and a discontinuous layer of a conductive material on a first side of the dielectric layer. The conductive particles are aligned to form a plurality of conductive paths from the first side to the second side of the dielectric material, and each of the conductive paths is formed of at least a plurality of conductive particles. The discontinuous layer includes a plurality of non-mutually connected portions that cover portions of, but not all of, the first side of the dielectric material such that exposed portions of the underlying first side of the dielectric material remain exposed through the discontinuous layer, yet the discontinuous layer facilitates
(Continued)

the electronic coupling together of a plurality of the conductive paths from the first side to the second side of the dielectric material.

22 Claims, 6 Drawing Sheets

Related U.S. Application Data continuation-in-part of application No. 13/834,948, filed on Mar. 15, 2013, now abandoned.

(51) Int. Cl.
*H05K 1/02* (2006.01)
*C09J 9/02* (2006.01)
*H01B 1/24* (2006.01)
*H01B 1/22* (2006.01)

(56) References Cited

U.S. PATENT DOCUMENTS

| | | | |
|---|---|---|---|
| 5,800,685 | A | 9/1998 | Perrault |
| 6,121,508 | A | 9/2000 | Bischof et al. |
| 7,651,638 | B2 | 1/2010 | Segall et al. |
| 9,775,235 | B2 * | 9/2017 | Burnham ............ H05K 1/0296 |
| 9,947,432 | B2 * | 4/2018 | Burnham ................ H01B 1/24 |
| 2004/0212386 | A1 | 10/2004 | Lin |
| 2007/0032719 | A1 | 2/2007 | Menon et al. |
| 2008/0197853 | A1 | 8/2008 | Swift et al. |
| 2010/0327232 | A1 | 12/2010 | Yamamoto et al. |
| 2012/0085580 | A1 | 4/2012 | Yamamoto et al. |
| 2012/0224285 | A1 | 9/2012 | Svasand et al. |
| 2013/0092881 | A1 | 4/2013 | Burnham et al. |
| 2014/0262446 | A1 | 9/2014 | Burnham et al. |

FOREIGN PATENT DOCUMENTS

| | | | |
|---|---|---|---|
| JP | H0788971 | A | 4/1995 |
| JP | H08315883 | A | 11/1996 |
| JP | H08315946 | A | 11/1996 |
| JP | H10247536 | A | 9/1998 |
| JP | 2000235877 | A | 8/2000 |
| JP | 2008203256 | A | 9/2008 |
| JP | 2009503235 | A | 1/2009 |
| JP | 2010102859 | A | 5/2010 |
| JP | 2012531026 | A | 12/2012 |
| JP | 2015503178 | A | 1/2015 |
| JP | 2016519390 | A | 6/2016 |

OTHER PUBLICATIONS

Japanese Office Action issued by the Japanese Patent Office in related Japanese Patent Application No. 2016-502496 dated Nov. 22, 2016, 11 pgs.
Rule 161(1) Communication issued in related European Patent Application No. 14721637.8-1308 dated Oct. 22, 2015, 2 pgs.
International Preliminary Report on Patentability issued by the International Bureau in related International Patent Application No. PCT/US2014/027962 dated Sep. 24, 2015, 11 pgs.
International Search Report & Written Opinion issued by the International Searching Authority in related International Patent Application No. PCT/US2014/027622 dated Nov. 3, 2014, 11 pgs.
Partial International Search Report & Invitation to Pay Additional Fees issued by the International Searching Authority in related International Patent Application No. PCT/US2014/027622 dated Jul. 4, 2014, 5 pgs.
Japanese Office Action issued in related Japanese Application No. 2016-502496 dated Sep. 7, 2017, (No English language translation provided).
Japanese Office Action issued in related Japanese Application No. 2018-003015 dated Jan. 24, 2019.
Indian Office Action issued in related Indian Application No. 2047/DELNP/2015 dated May 13, 2019.
Ramkumar, S.M., et al., "Influence of Process Parameters on Component Assembly and Drop Test Performance using a Novel Anisotropic Conductive Adhesive for Lead-free Surface Mount Assembly" Electronics Components and Technology Conference, 2008, pp. 225-233.

* cited by examiner

SYSTEMS AND METHODS FOR PROVIDING SURFACE CONNECTIVITY OF ORIENTED CONDUCTIVE CHANNELS

PRIORITY

This application is a CON of Ser. No. 14/209,213 (filed Mar. 13, 2014, now U.S. Pat. No. 9,775,235), which application is a CIP of Ser. No. 13/834,948 (filed Mar. 15, 2013, now ABN).

BACKGROUND

The invention generally relates to conductive polymeric and elastomeric materials for use in a wide variety of applications, including without limitation, conductive adhesives, conductive gaskets and conductive films.

The design of an electrically conductive pressure sensitive adhesive (PSA), for example, has long presented challenges at least because adhesive strength and flexibility generally decrease with increased electrical conductivity. The materials that are typically used (added) to provide good electrical conductivity are generally less flexible and inhibit adhesion. A conventional way to prepare a conductive coating is to fill a polymeric material with conductive particles, e.g., graphite, silver, copper, etc., then coat, dry and cure the polymeric binder. In these cases the conductive particles are in such a concentration that there is a conductive network formed when the particles are each in physical contact with at least one other neighboring particle. In this way, a conductive path is provided through the composite.

For pressure sensitive adhesives, however, if the particle concentration is high enough to form a network in which particle-to-particle contact is maintained then there is little chance that the polymer (e.g., elastomer) system of the PSA component is present in high enough concentrations to flow out to make surface-to-surface contact between the substrates and an electrode, i.e., act as an adhesive. Conversely, if the PSA component is in sufficient concentration to make sufficient surface contact to the substrate, the PSA would have to interrupt adjacent conductive particles such that particle-to-particle contact is disrupted.

Another type of electrically conductive PSA includes conductive spherical particles with diameters equal to or greater than the thickness of the PSA. In this fashion the signal or current may be carried along the surface of the particles, thus providing current flow anisotropically in the z dimension of the adhesive. The continuity of the adhesive however, may be compromised.

Salts, such as sodium or potassium chloride, readily dissolve when in an aqueous medium, and their ions dissociate (separate into positive and negative ions). The dissociated ions may then convey an electrical current or signal. For this reason, salts have long been added to water, which then may be added to polymeric and elastomeric materials, to provide good electrical conductivity. For example, U.S. Pat. No. 6,121,508 discloses a pressure sensitive adhesive hydrogel for use in a biomedical electrode. The gel material is disclosed to include at least water, potassium chloride and polyethylene glycol, and is disclosed to be electrically conductive. U.S. Pat. No. 5,800,685 also discloses an electrically conductive adhesive hydrogel that includes water, salt, an initiator or catalyst and a cross linking agent. The use of such hydrogels however, also generally requires the use of a conductive surface at one side of the hydrogel (away from the patient) that is capable of receiving the ionically conductive charge, such as silver/silver chloride, which is relatively expensive.

While these hydrogel/adhesives can have good electrically conductive properties, they often have only fair adhesion properties. Another downside is that the electrical conductivity changes with changing water content, such as changes caused by evaporation, requiring that the hydrogels be maintained in a sealed environment prior to use, and then used for a limited period of time only due to evaporation.

U.S. Pat. No. 7,651,638 discloses a water insensitive alternating current responsive composite that includes a polymeric material and a polar material (such as an organo salt) that is substantially dispersed within the polymeric material. The polymeric material and the polar material are chosen such that they each exhibit a mutual attraction that is substantially the same as the attraction to itself. Because of this, the polar material neither clumps together nor blooms to a surface of the polymeric material, but remains suspended within the polymeric material. This is in contrast to the use of salts in other applications wherein the salt is intended to bloom to the surface (to provide a conductive layer along a surface, e.g., for static discharge).

U.S. Pat. No. 5,082,595 discloses an electrically conductive pressure sensitive adhesive that includes carbon particles, and the conductive adhesive is disclosed to be prepared by incorporating black filler (carbon) into the pressure sensitive adhesive in such a manner as to impart electrical conductivity, yet have a concentration low enough to avoid adversely affecting the physical properties (such as tack) of the adhesive. In particular, this patent states that slurry of the carbon black in an organic solvent is formed under mild agitation or stirring in the absence of high shear, so that carbon structures are thereby formed. The mixture may then be introduced into an adhesive. Such a composite, however, may not provide sufficient adhesiveness and conductivity in certain applications.

Such composites may also include areas with relatively greater or lesser concentrations of structures of carbon black. Certain conductive polymeric and elastomeric materials that include conductive particles in concentration within the polymeric or elastomeric material, may therefore exhibit inconsistent electrical properties over the surface of the material.

There remains a need therefore, for a composite for use as a conductive polymeric material that provides electrical conductivity without compromising the desired properties of the polymeric material, and further, there is a need for conductive polymeric materials that provide consistent electrical characteristics.

SUMMARY

In accordance with an embodiment, the invention provides an electrically conductive composite that includes a dielectric material layer having a first side and a second side; conductive particles within the dielectric material, and a discontinuous layer of a conductive material on a first side of the dielectric material. The conductive particles are aligned to form a plurality of conductive paths from the first side to the second side of the dielectric material, and each of the conductive paths is formed of at least a plurality of conductive particles. The discontinuous layer of a conductive material includes a plurality of non-mutually connected portions that cover portions of, but not all of, the first side of the dielectric material such that exposed portions of the underlying first side of the dielectric material remain exposed through the discontinuous layer, yet the discontinuous layer facilitates the electronic coupling together of a plurality of the conductive paths from the first side to the second side of the dielectric material.

In accordance with another embodiment, the invention provides an electrically conductive composite including a dielectric material having a first side and a second side, conductive particles within the dielectric material, and a patterned layer of a conductive material on a first side of the dielectric material. The conductive particles are aligned to form a plurality of conductive paths from the first side to the second side of the dielectric material, and each of the conductive paths is formed of at least a plurality of conductive particles. The patterned layer includes a plurality of mutually connected portions that cover portions of, but not all of, the first side of the dielectric material such that exposed portions of the underlying first side of the dielectric material remain exposed through a plurality of portions of the patterned layer, yet the patterned layer facilitates the electronic coupling together of a plurality of the conductive paths from the first side to the second side of the dielectric material.

In accordance with a further embodiment, the invention provides an electrically conductive composite that includes a dielectric material having a first side and a second side, conductive particles within the dielectric material, and a layer of a conductive material on a first side of the dielectric layer. The conductive particles are aligned to form a plurality of conductive paths from the first side to the second side of the dielectric material, and each of the conductive paths is formed of at least a plurality of conductive particles. The layer of conductive material has a thickness of less than about 10 mils and includes open portions through which exposed portions of the underlying first side of the dielectric material remain exposed through the open portions of the layer of conductive material, yet the layer of conductive material facilitates the electronic coupling together of a plurality of the conductive paths from the first side to the second side of the dielectric material.

In accordance with a further embodiment, the invention provides a method of forming an electrically conductive composite. The method includes the steps of providing a dielectric material; dispersing conductive particles within the dielectric material; conducting electrophoresis or dielectrophoresis to cause said conductive particles to become aligned to form a plurality of conductive paths from a first side of the dielectric material to a second side of the dielectric material, each of said conductive paths being formed of at least a plurality of conductive particles; depositing a partial layer of conductive material on a first side of the dielectric layer, said frangible layer including a plurality of mutually conductive portions that cover portions of, but not all of, the first side of the dielectric material such that exposed portions of the underlying first side of the dielectric material remain exposed through a plurality of portions of the partial layer, yet the partial layer facilitates the electronic coupling together of a plurality of the conductive paths from the first side to the second side of the dielectric material; and applying a release layer to the first side of the dielectric material together with the partial layer of conductive material, to provide that the release layer may be later removed, permitting the first side of the dielectric material together with the partial layer of conductive material to be applied to a subject.

BRIEF DESCRIPTION OF THE DRAWINGS

The following description may be further understood with reference to the accompanying drawings in which.

The drawings are shown for illustrative purposes only.

DETAILED DESCRIPTION

Applicant has discovered that certain conductive materials, such as materials that include conductive paths that are formed by electrophoresis, may exhibit inconsistent electrical properties. For example, a conductive material may include conductive paths that are formed by an electrophoretic process that causes conductive particles (that are initially randomly dispersed within a continuous medium), to align in the presence of an electric field, thereby forming the conductive paths. The continuous medium may or may not include a polar material as described in U.S. Pat. No. 7,651,638, the disclosure of which is hereby incorporated by reference in its entirety.

If the conductive composite is then employed in an application that requires certain electrical properties in specific areas of the composite, the electrical properties may be inconsistent. Because of this, the formed structure channel density may be less where it is needed and greater where it is not, and the polymeric adhesive density may be less where it is needed and greater where it is not.

Figure 1:
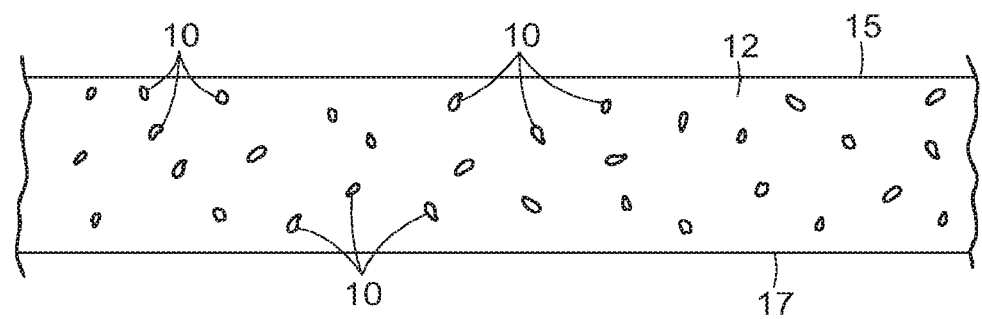
FIG. 1 shows an illustrative diagrammatic view of a composite for use in accordance with an embodiment of the invention prior to electrophoresis.
Figure 2:
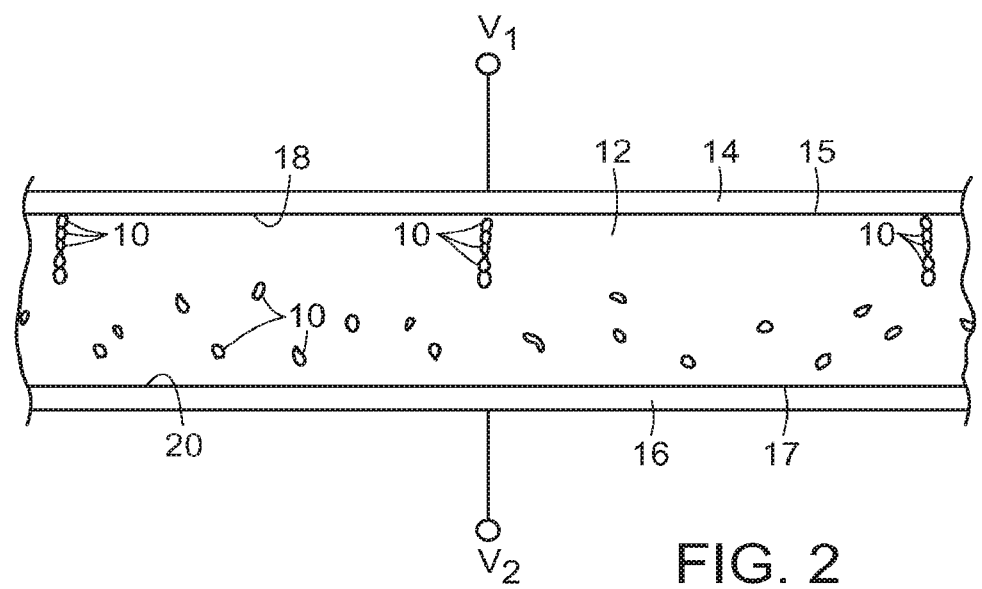
FIGS. 2 and 3 show illustrative diagrammatic views of the composite of FIG. 1 during electrophoresis.
Figure 3:
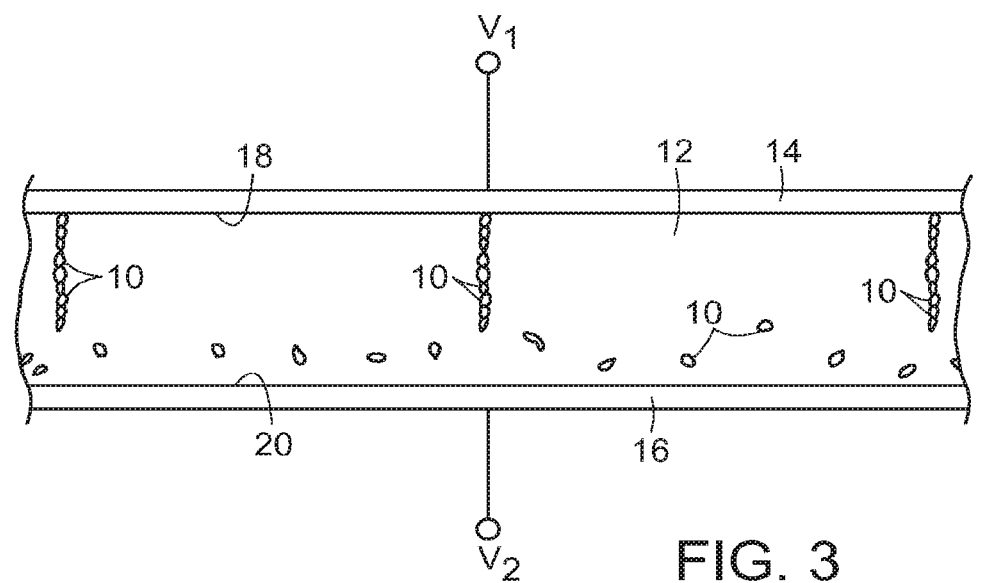
Figure 4:
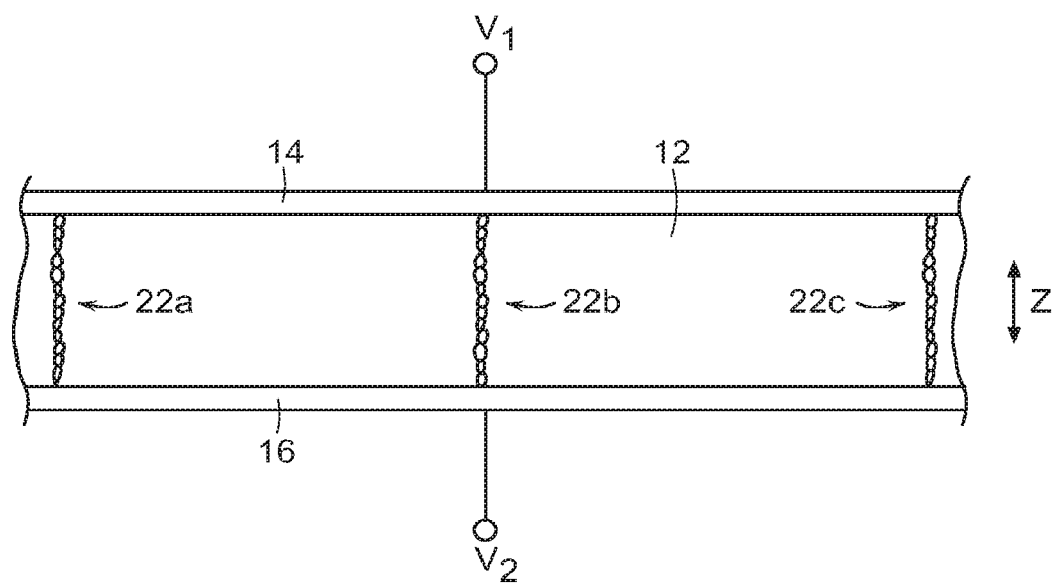
FIG. 4 shows an illustrative diagrammatic view of the composite of FIG. 1 following electrophoresis.

As shown in FIG. 1, a composite of the present invention prior to electrophoresis includes conductive materials 10 (e.g., 5% by weight carbon particles) within a dielectric material 12 (e.g., a pressure sensitive adhesive, a heat activatable adhesive or a radiation curable adhesive). As shown in FIGS. 2 and 3, when conductive plates 14, 16 are positioned on either side 15, 17 of the composite and an electric field ($V_1$-$V_2$) is applied, the conductive material 10 naturally find areas where an initial conductive particle becomes attracted to a first inner surface 18 of the composite. As soon as this happens the distance between the initially attached conductive materials and an opposing second inner surface 20 is then shorter than the full distance between the inner surfaces 18, 20. This causes more conductive particles to become attracted to the ends of the thus forming channels, and within a very short time, conductive channels 22a, 22b, 22c are formed across the composite as shown in FIG. 4. If an alternating electric field is applied, the particles will alternately build from opposing inner surfaces (which may be referred to as dielectrophoresis).

When plate conductors (e.g., 14, 16) are employed the placement of the channels is believed to be largely a function of slight variations in the conductors 14, 16 that favor an initial particle becoming attracted to a first surface. Once this occurs, the channel locations are thus defined. The use of one or more point conductors, on the other hand, would provide certainty in the placement of the channels. The plate conductors (or layers of conductive material) may be formed of a wide variety of conductive material, including conductive carbon and metallic foil.

Conductive particles, dispersed in a continuous polymeric layer and then acted upon by an electric field may, under certain conditions therefore, agglomerate to form "Z" directional conductive channels, providing electrophoretically formed conductive pathways through a polymeric composite. Once formed, these conductive channels are fairly durable and permit a biomedical electrode (such as an EKG electrode) to pass certain standards for such electrodes as discussed in more detail below. The conductive particles may include any of carbon or metal (including silver and silver nanoparticles). It is also believed that a large number of thermoplastic polymers may be employed in place of the pressure sensitive adhesive when subjected to a sufficiently high or long standing electromagnetic field. Thus heat activated adhesives and even thermally or radiation thermoset adhesive, may also be employed in certain applications. As used herein the term "activation" refers to both electrophoretic (DC voltage applied) and dielectrophoretic (AC voltage applied).

Figure 5:
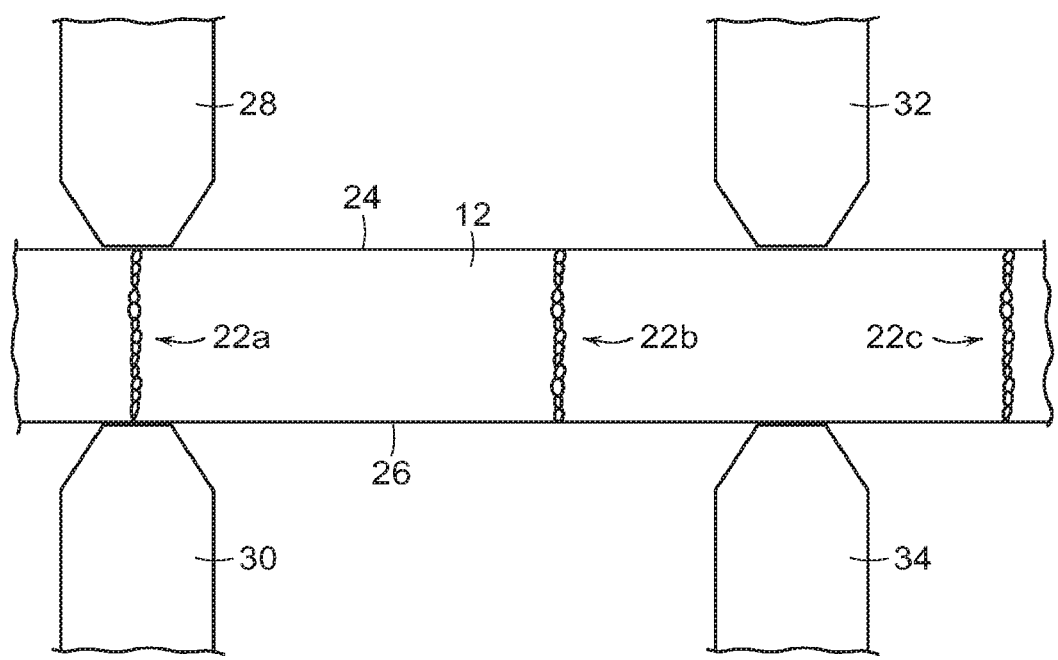
FIG. 5 shows an illustrative diagrammatic view of the composite of FIG. 4 during analysis of certain of its electrical properties.

When a composite that includes randomly located channels is tested for its electrical characteristics, these characteristics (e.g., impedance), may vary for different locations on the composite. For example, FIG. 5 shows a composite that includes the pressure sensitive adhesive 12 and conductive channels 22a, 22b, 22c wherein impedance testing probes 28 and 30 placed on outer surfaces 24, 26 of the composite (and which happen to align with channel 22a) would measure a much lower impedance than would impedance testing probes 32, 34 (which do not align with any of the conductive channels 22a, 22b, 22c). The results of such impedance tests would be widely varying depending on whether the probes happened to be positioned in alignment with a conductive channel.

Figure 6:
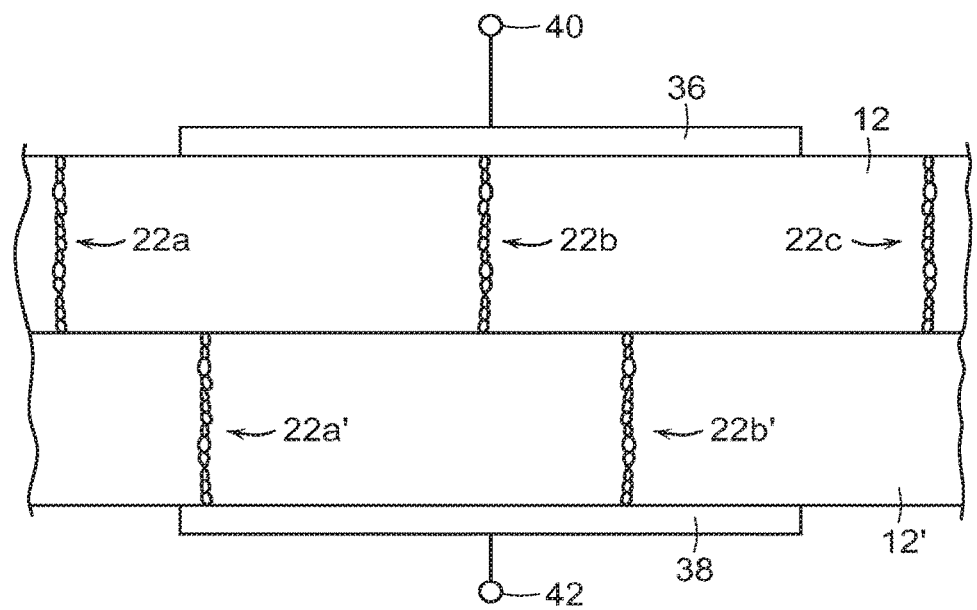
FIG. 6 shows an illustrative diagrammatic view of two composites of FIG. 4 being combined face to face and include electrodes for coupling to impedance monitoring equipment.

Certain other tests may involve overlaying a first conductive composite on top of another conductive composite and measuring electrical characteristics across both composites combined. As shown in FIG. 6, if a first conductive composite including the pressure sensitive adhesive 12 and conductive channels 22a, 22b, 22c were place over a second conductive composite including a pressure sensitive adhesive 12' and conductive channels 22a' and 22b', the channels 22a' and 22b' may not align with any of the channels 22a, 22b or 22c. No conductive path would therefore, be provided between test plates 36, 38 that are coupled to impedance test sources 40, 42. Even though each of the composites includes conductive channels, because their channels are not aligned, the test would report high impedance.

A test that involves combining two such composites (as discussed above with reference to FIG. 6) is commonly used to test the impedance of biomedical electrodes. If the test results in a single impedance value of greater than 3,000 Ohms, the device has failed the test in accordance with AAMI EC12-2000-4.2.2.1. The results of the test may therefore vary considerably (between passing and failing) depending on the variability of whether conductive channels happen to become aligned between the test plates 36, 38.

In particular, an example of such a biomedical electrode is an EKG electrode where preformed conductive structures from two test electrodes being put through AAMI-EC-12-2000-4.2.2.1 protocol may not have a conductive structure from one of the test electrodes making contact with a conductive structure on the second test electrode. Thus each electrode individually may well work in detecting EKG signals, it may not pass AAMI-EC-12-2000-4.2.2.1, which is a major test in qualifying usable EKG electrodes.

For example, when EKG electrodes are activated individually (i.e., not in contact with a second electrode during the activation process) and then put face to face to run AAMI-EC-12-2000-4.2.2.1 (test for impedance), the "Z" directional conductive structures formed on each electrode (conductive channels) may not line up to form connected pathways across the two electrodes. No contact between the "Z" directional conductive channels from one electrode and the "Z" directional conductive channels to the second electrode would result in a failure in this qualification test.

A solution to this problem involves applying a conductive material over a portion of the surface of the preformed or preplaced conductive structure containing adhesive. This surface conductive material would make contact with the preformed conductive structures yielding a larger surface contact area, therefore allowing greater alignment of the conductive structures from the two electrodes to each other thus facilitating the passing of AAMI-EC-12-2000-4.2.2.1.

Figure 7:
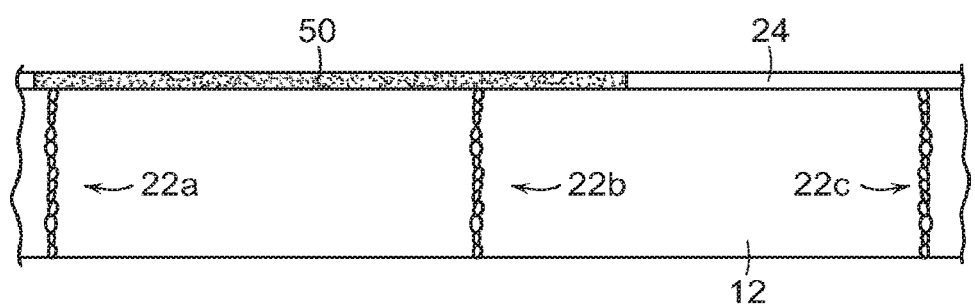
FIG. 7 shows an illustrative diagrammatic view of a portion of composite in accordance with an embodiment of the present invention.
Figure 8:
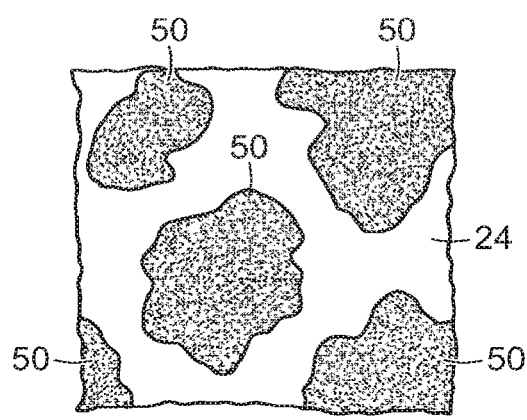
FIG. 8 shows an illustrative diagrammatic plan view of a portion of a composite in accordance with an embodiment of the present invention that includes a discontinuous layer of conductive material.

As shown in FIG. 7, in accordance with an embodiment of the present invention, a conductive layer 50 is applied over a portion of, but not all of, an exposed surface 24 of the composite. As further shown in FIG. 8, the conductive layer 50 may be discontinuous, as long as many of the conductive portions each cover a plurality of conductive channels so that a probe positioned on the outer surface will contact some portion of the conductive layer 50

Figure 9:
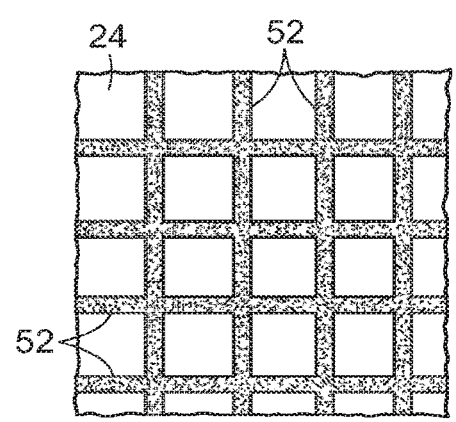
FIG. 9 shows an illustrative diagrammatic plan view of a portion of a composite in accordance with another embodiment of the present invention that includes a continuous patterned layer of conductive material.
Figure 10:
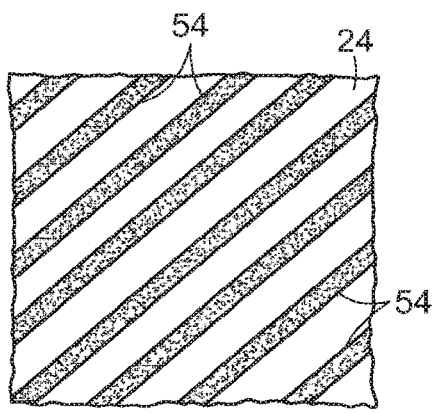
FIG. 10 shows an illustrative diagrammatic plan view of a portion of a composite in accordance with an embodiment of the present invention that includes a discontinuous layer of conductive material in a striped pattern.
Figure 11:
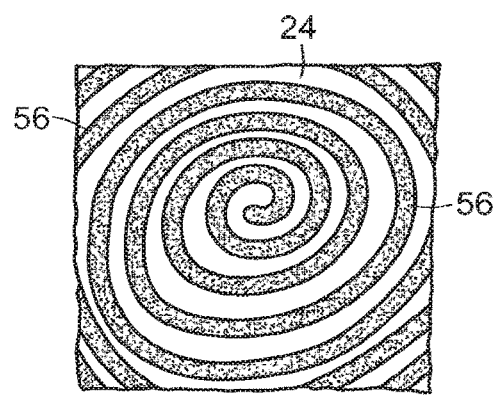
FIG. 11 shows an illustrative diagrammatic plan view of a portion of a composite in accordance with an embodiment of the present invention that includes a continuous layer of conductive material in a spiral pattern.
Figure 12:
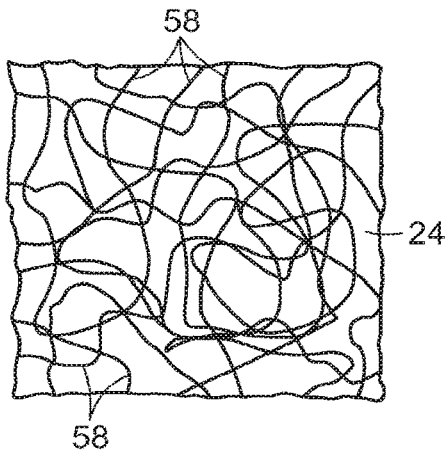
FIG. 12 shows an illustrative diagrammatic plan view of a portion of a composite in accordance with an embodiment of the present invention that includes a continuous layer of conductive material in a random pattern.
Figure 13:
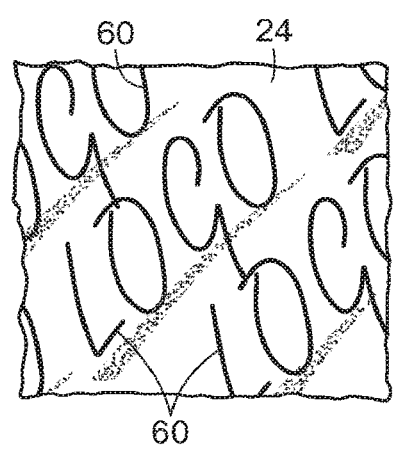
FIG. 13 shows an illustrative diagrammatic plan view of a portion of a composite in accordance with an embodiment of the present invention that includes a layer of conductive material in a logo pattern.

As shown in FIG. 9, the conductive layer may be provided as a continuous pattern that forms a grid 52, connecting a large number of conductive channels. As shown in FIG. 10, the conductive layer may be formed as a plurality of discontinuous patterned shapes such as stripes 54. As shown in FIG. 11, the conductive layer may be formed as a continuous spiral pattern 56. As shown in FIG. 12, the conductive layer may be formed as a continuous random line pattern 58. As shown in FIG. 13, the conductive layer may be formed as a continuous or discontinuous logo pattern 60.

The conductive layers 50, 52, 54, 56, 58 and 60 may be formed in a variety of ways, for example including but not limited to, printing of a conductive ink, or the application of a frangible film by transfer as discussed below in more detail with regard to FIGS. 14A and 14B.

To insure that pre-activated ECG electrodes pass the AAMI Impedance Test therefore, a conductive layer is placed over the conductive channels contacting at least one or more "Z" directional conductive channels and further, making them of such a size so as to increase the probability that at least two such surface conductive layers make contact with one another.

The composition and application of this conductive layer material may involve the application of a carbon dispersion based coatable or printable material such as FLEXcon's EXV-216 carbon dispersion sold by FLEXcon Company, Inc. of Spencer, Mass. at a thickness of between about 1 mil and about 10 mil, and preferably between about 2 mil and about 5 mil. This material may be coated either directly by screen, gravure, or flexographic printing etc., directly onto the continuous polymeric layer, or printed to a specific arrangement of either continuous or discrete elements on a carrier with limited adhesion to said coating or ink. The preprinted pattern may then be applied to activated electrode via a transfer mechanism.

Figure 14A:
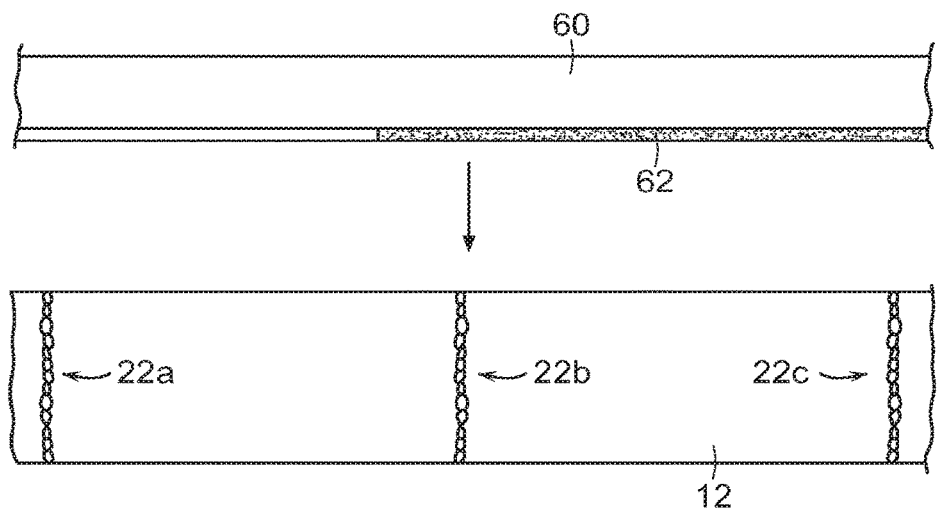
FIGS. 14A and 14B show an illustrative diagrammatic view of a composite in accordance with an embodiment of the invention that show a thin film conductive layer being transferred from a carrier to the composite.
Figure 14B:
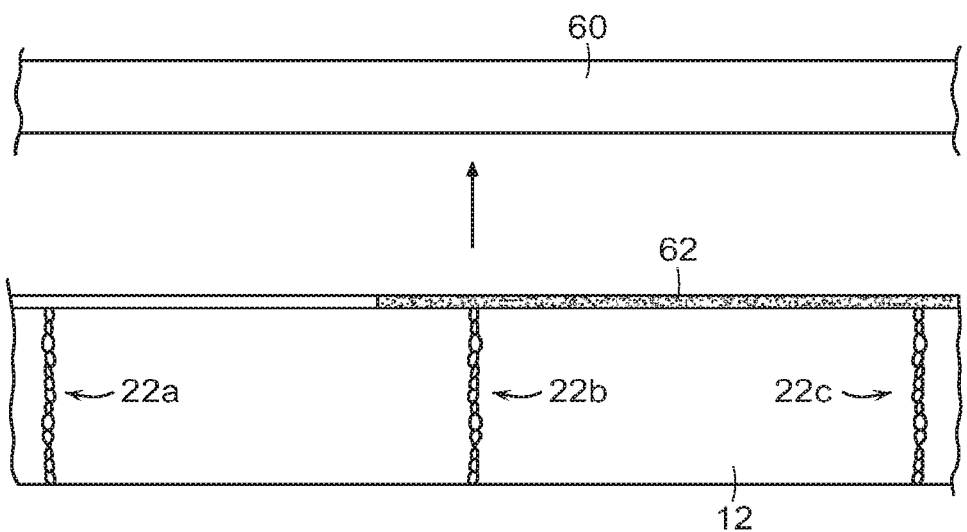

As shown for example, in FIGS. 14A and 14B, such a conductive layer 62 may be coated or printed onto a carrier substrate 64. The conductive layer 62 may be a frangible layer that is formed by printing or other deposition technique, or by thin film transfer, and may, for example, include conductive ink or a metal foil. When the carrier substrate is brought into contact with the polymer 12 (FIG. 14A), the conductive layer 62 is transferred to the polymer 12 as it has a greater adhesion to the polymer 12. When the substrate 64 is then separated to from the polymer 12 (FIG. 14B), the conductive layer 62 remains with the polymer 12 as it has the greater adhesive to the polymer. In other embodiments, one may apply the conductive ink as a single continuous layer to a releasable substrate and then, using a patterned die, transfer the desired geometric form to the electrode.

An alternative conductive material from which to construct the conductive layer may be from the numerously available metallic foils or metallic conductive particle inks, metal transfer made from about 2500 Å deposition of aluminum vacuum deposited on a silicone coated 2 mil (500µ) PET film, were also determined to be viable as a conductive bridge material.

Figure 15:
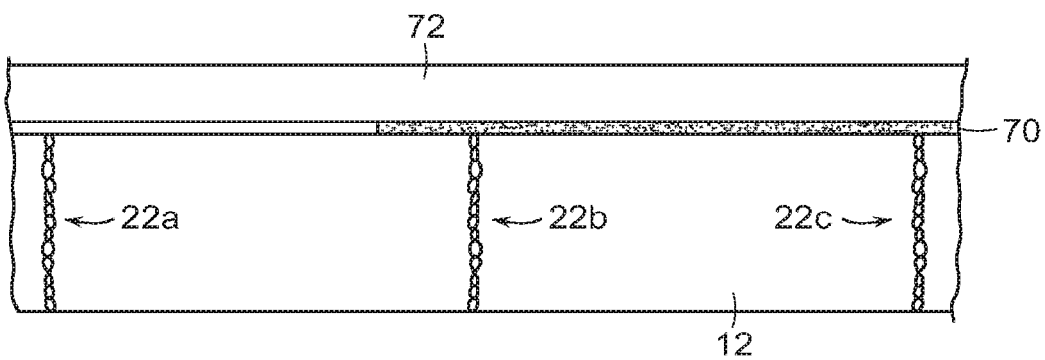
FIG. 15 shows an illustrative diagrammatic view of a composite in accordance with an embodiment of the invention with a release layer applied to the subject contact surface thereof.

As shown in FIG. 15, a composite of the invention that includes a partial layer 70 of conductive material (e.g., a conductive layer 50, 52, 54, 56, 58 or 60), may be applied to a dielectric material 12 having formed conductive channels 22a, 22b, 22c as discussed above, and a release liner 72 may then be applied to the exposed surface of the dielectric material 12 that includes the partial layer 70. During use, the release layer 72 may be removed, and the composite may be adhered to a subject (e.g., as a biomedical electrode applied to a patient).

Figure 16:
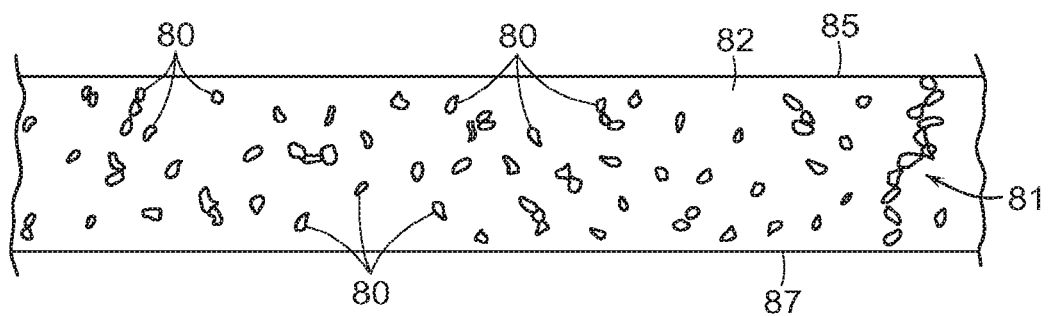
FIG. 16 shows an illustrative diagrammatic view of a composite for use in accordance with a further embodiment of the invention prior to electrophoresis.
Figure 17:
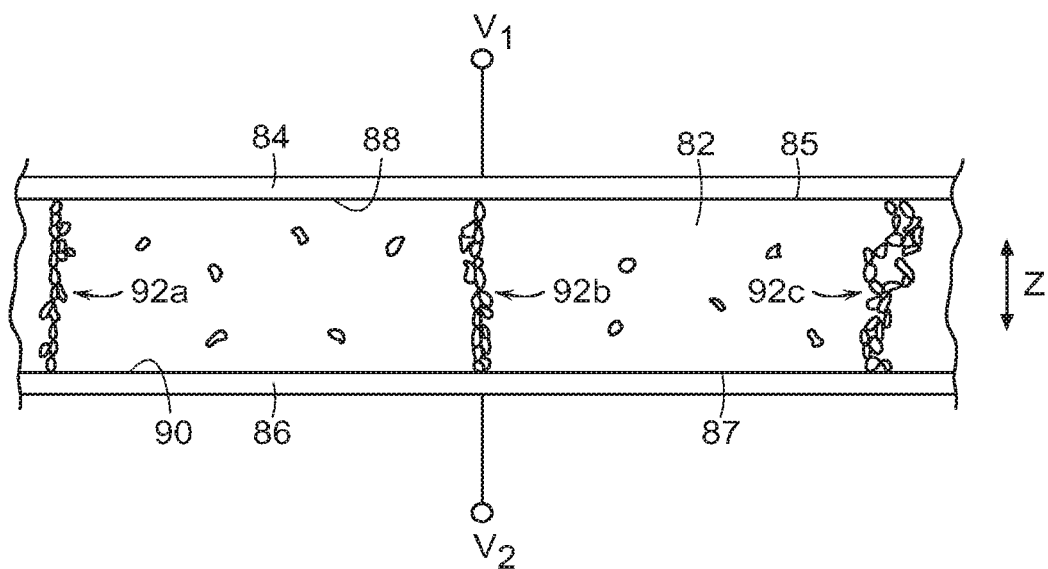
FIG. 17 shows an illustrative diagrammatic view of the composite of FIG. 16 following electrophoresis

As shown in FIG. 16, a composite of a further embodiment of the present invention prior to electrophoresis includes conductive materials 80 (e.g., 10% to 25% by weight carbon particles) within a dielectric material 82 (e.g., a pressure sensitive adhesive, a heat activatable adhesive or a radiation curable adhesive). When conductive plates 84, 86 are positioned on either side 85, 87 of the composite and an electric field ($V_1$-$V_2$) is applied, the conductive material 80 naturally find areas where an initial conductive particle becomes attracted to inner surfaces 88, 90 as discussed above due to either electrophoresis or dielectrophoresis. This causes conductive channels 92a, 92b, 92c to be formed across the composite as discussed above and shown in FIG. 17. Note that the original composite shown in FIG. 16 includes at least one conductive path 81 that was naturally formed in the composite prior to electrophoresis or dielectrophoresis. Following electrophoresis or dielectrophoresis further conductive particles are agglomerated onto the path 81 in forming the path 92c.

Figure 18:
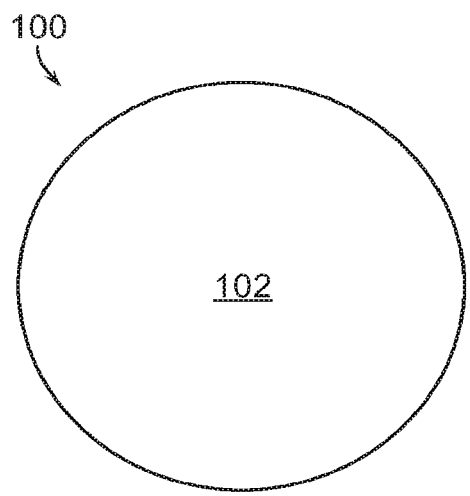
FIG. 18 shows an illustrative diagrammatic plan view of a signal receptive composite in accordance with an embodiment of the invention in which at least one layer of conductive material covers an entire surface of the dielectric layer.
Figure 19:
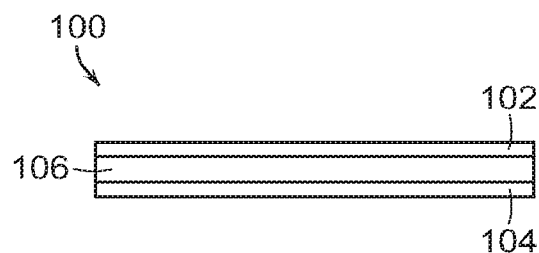
FIG. 19 shows an illustrative diagrammatic side view of the signal receptive composite of FIG. 18.

FIGS. 18 and 19 show a further embodiment of the invention in which signal receptive composite 100 includes top and bottom conductive layers 102, 104 on either side of a dielectric material 106 that includes the polar material. The conductive layers therefore, may in various embodiments, cover all of either or both sides of the dielectric material. In certain embodiments, the electrophoresis or dielectrophoresis may be applied directly through the conductive layers 102, 104, which form the conductive layers for the plate conductors of the biomedical electrode.

Example 1

To a 2 mil (50µ) polyethylene terephthalate (PET) film was coated a conductive carbon dispersion of FLEXcon's EXV-216 carbon dispersion at a surface resistance of ~80 Ω/sq. Over this was coated 2.5 mil (63µ) dispersion of FLEXcon's V-12 HW with 10% conductive carbon (by weight on total solids). Using the AAMI impedance test protocol discussed above, the "Z" direction impedance was measured and averaged 1300 k Ω. When a ring with a 0.69" (17.5 mm) O.D. and 0.25" (6.36 mm) I.D. composed of FLEXcon's EXV-216, was placed on top of the V-12 HW/Carbon mixture on each of two electrodes and the two electrodes were then placed face to face with the rings making contact against each other and the V-12HW adhesive, the resulting Z direction impedance averaged 775Ω.

The difference in impedance is believed to be the result of the conductive rings connecting a few, random, occasional, Z directional conductive channels formed naturally by just having conductive particles dispersed in the polymeric component, in this case a PSA. The conductive ring (bridge) makes contact with some of these random conductive channels and provides an X-Y direction component to the connectivity of the pathways resulting in lower net impedance. It should be noted that if the V-12 HW/Carbon mixture, as described above was subjected to electrophoretic aggregation, thus forming many more conductive channels the impedance would be at least 2× lower or around 300Ω or less.

It is important to note that the before activation impedance (775) at a 10% conductive carbon loading has a significantly distribution, in this case using 30 individual readings the standard deviation is 65% of the mean. The post activation standard deviation is 58% of the mean.

In another example using a 20% carbon loading with the same conductive ring being used as the bridge, the before impedance mean was 650 Ω with a standard deviation at 63% of said mean. Post activation the mean was again 300 Ω with the standard deviation at 20% of the mean.

In all such cases the impedance test done as per AAMI EC12 2000-4.2.2.1.

It was assumed that the random conductive channels without the surface conductive bridge are present, but when the two electrodes are placed adhesive to adhesive said conductive channels fail to line up.

Another consideration of using a surface conductive layer as a conductive bridge is that it could act as a contact through which the activation process is accomplished. In this scenario the conductive layer would be placed on the surface of the dispersed conductive particle polymer mix, then electrical contact made to the conductive bridge and the "conductive channels" would form between the bridge layer and the second electrical contact.

Of course, if either the bridge layer or the second electrical contact is constructed with multiple elements, it becomes possible to activate the conductive particle polymer mixture in a selective pattern. This allows unique electrical pathways to be created specific to desired patterns which would form the basis for an electrical "thumbprint".

There is a limitation as to the extent to which the area of the bridge material vs. the total area of the continuous polymer layer, at least less than 100%. This becomes quite apparent when the continuous polymer layer is to act as an adhesive. An example of this important limitation can be realized in the case of an EKG electrode. Here sufficient contact area of the PSA to maintain adequate bond to the patient's skin. Obviously the tackier the PSA, the less surface area would be needed to maintain adhesion, however a stiffer, less conformable device would require more surface area to establish and maintain above. Further other environmental conditions such as dryness temperature at which the bond must be maintained as well as other structural forces, attaching wires for example, must be considered when determining what is the minimum or preferable % bonding area, which in turn directs the maximum surface area of the surface conductive layer. Thus there is not generally applicable hard and fast rule as to the extent of conductive bridge material on the surface of an adhesive layer, the totality of the mechanical, environmental etc. requirements dictate the limit on a specific application. It has also been found that carbon is not the only conductive particulate, silver for one, can form conductive structures by electrophoresis.

Example 3

Silver nanoparticle dispersion, obtained from Chasm Technology Inc., 480 Neponset St., Canton, Mass. 02021, designated, 120727-01, was blended into FLEXcon's V-95 at ~0.75% silver by weight to the adhesive polymer dry. Samples were prepared as done for the carbon particle system already described, applied to a EXV-216 conductive carbon coating at 1.3 mil (32.5μ) dry deposition, with a resulting surface resistance of ~80 Ω/sq. to a 2 mil white PET film. The silver nano-particles & V-95 mix was then coated to produce a 2 mil dry thickness. The adhesive (V-95) nanoparticle dried mix was then applied to a stainless steel plate, which would serve as a ground for the activation stage. To activate, a 10 g capacitor was charged to 200 VDC and discharged through a 20 K Ω resistor on through the V-95/Silver nanoparticle mixture to ground.

With an average starting impedance, measured at 10 Hz and 20 mV, of 5200 K Ω the samples then yielded an average of 1.4 K Ω after activation. As with the carbon particle, analog structures running through the thickness were observed.

Example 3

A second carbon dispersion was prepared by mixing into FLEXcon's V-95 PSA 5% "Black Pearls" carbon black from the Cabot Corporation, Boston, Mass. and ~7% (on solids) Arquad HTL8-MS, being used here more as a dispersant aid. A 2 mil (50 μm) dry coating was applied to a substrate, 2 mil (50 μm) white PET coated with FLEXcon's EXV-216 to a surface resistance of 80 Ω/sq. inch. The pre-activation impedance averaged 2.5 mega Ω; post activation the impedance averaged 2.7 K Ω. Activation conditions were the same as for the previously used carbon dispersions (from the test apparatus used in AAMI EC 12-2000-4.2.2.4 Defibrillation Overload Recovery test).

In accordance with an embodiment of the invention, the continuous dielectric layer may be covered with a conductive bridging layer across 100% of the surface of the dielectric layer. In this circumstance any adhesion characteristics of the continuous dielectric layer is negated.

Applications of this would be, for example, where a biomedical electrode is being held in place by some mechanical device, a halter or elastic garment, etc. and the adhesive properties are not required. In such a circumstance the conductive bridging material would cover the entire dielectric surface.

The continuous conductive layer would allow for a biological time varying signals to be picked up and transferred to a monitoring device either through capacitive coupling where the dielectric layer moiety of the signal receptive material (SRM) has a polar material uniformly dispersed within it but no conductive particles or a combination of capacitive coupling and direct electrical contact when the SRM consist of a dielectric material with a polar material uniformly dispersed within it and has conductive particles some of which have formed a conductive channel through the "Z" dimension connecting a conductive layer to which the SRM is applied to a continuous conductive layer applied to the opposite side of the SRM.

Likewise a continuous conductive layer applied over a dielectric material with no polar material, but does have conductive particles, some of which have formed a conductive channel through the "Z" dimension connecting a conductive layer to which the SRM is applied to a continuous conductive layer applied to the opposite side of the SRM.

The dielectric material, even in the case where there is a direct electrical connection made between the electrical contact leading to the monitor and the continuous conductive layer making contact to the source of the biological signal, through "Z" dimensional conductive channels, has a significant mechanical function. When the dielectric material is chosen to have flexibility and viscoelastic properties, it facilitates maintaining a uniform contact to the bio-signal source by acting as movable material which would allow for the equilibrating of stresses between the conductive layer in contact with the signal source and conductive layer leading to the monitor.

Example 4

An SRM material was provided using FLEXcon's V-95 adhesive to which was added 25% by dry weight to dry weight of the total mixture, of Arquad HTL-8 MS-CLR (from Akzo Nobel, 525 West Van Buren, Chicago, Ill. 60607) and 15% by dry weight of a conductive carbon, Aquablak 5909 (from Solution Dispersions, Cynthiana, Ky. 41031. The wet mixture was applied to a release coated polyester film and oven dried to remove solvent.

The dry SRM was then coated on a first side with FLEXcon's EXV 468BK, a conductive coating, to a dry thickness of 2.5 mil. The release coated polyester film was then removed from the SRM and an insulating polyester mask layer with a 2 inch by 2 inch opening was applied over the SRM Applied over the 2 inch by 2 inch opening of adhesive, was a continuous conductive material at ~2.5 mil in thickness, comprising another second layer of EXV 468BK.

This composite was attached by a copper cable to an ECG monitor (MAC 1200 from GE Medical Systems), to the second conductive layer of EXV-468BK. The first conductive layer of EXV 468BK was pressed to the skin of the test subject. Following testing, an ECG trace resulted which matched the trace yielded by the electrodes as described in US Application U.S. Patent Application Publication No. 2013/0092881.

In the same fashion an electrode constructed as described in U.S. Pat. No. 7,651,638 with the additional conductive layer of EXV-468NK such that all of the adhesive area is covered. In this example the SRM contains a polar material uniformly dispersed in the dielectric; no additional conductive particles are added. The results showed no differences in the ECG plot vs. those obtained with the SRM described in U.S. Pat. No. 7,651,638.

Another example was tested using a second composition described in U.S. Patent Application Publication No. 2013/0092881. In this example an SRM with just conductive particles, no polar material was prepared, in the fashion already described. The results were the same, i.e. the ECG plot was identical to that obtained by the same SRM (without the polar material). The conclusion is that covering the SRMs is provided with a conductive layer that does not inhibit the signal responsiveness of these electrodes.

Those skilled in the art will appreciate that numerous modifications and variations may be made to the above disclosed embodiments without departing from the spirit and scope of the present invention.

What is claimed is:

1. An electrically conductive composite comprising:
a dielectric material having a first side and a second side;
conductive particles within the dielectric adhesive material, said conductive particles including a first set of conductive particles that are aligned to form a plurality of conductive paths formed by electrophoresis from the first side to the second side of the dielectric material, each of said conductive paths formed by electrophoresis being formed of at least a plurality of conductive particles, said conductive particles including a second set of conductive particles that form naturally occurring conductive paths not requiring electrophoresis; and
a layer of a conductive material on a first side of the dielectric material, said layer of conductive material having a thickness of less than about 10 mil, wherein the layer of conductive material facilitates the electronic coupling together of a plurality of the conductive paths formed by electrophoresis from the first side to the second side of the dielectric material, wherein each of the conductive paths formed by electrophoresis remains without curing the dielectric material.

2. The electrically conductive composite as claimed in claim 1, wherein said conductive particles further include a second set of conductive particles that form naturally occurring conductive paths not requiring electrophoresis.

3. An electrically conductive composite as claimed in claim 1, wherein said conductive particles include carbon.

4. An electrically conductive composite as claimed in claim 1, wherein said conductive particles include a metal.

5. An electrically conductive composite as claimed in claim 4, wherein said conductive particles are silver.

6. An electrically conductive composite as claimed in claim 5, wherein said conductive particles are silver nanoparticles.

7. An electrically conductive composite as claimed in claim 1, wherein said conductive paths are formed by dielectrophoresis.

8. An electrically conductive composite as claimed in claim 1, wherein said conductive layer includes conductive carbon.

9. An electrically conductive composite as claimed in claim 1, wherein said conductive layer includes metallic foil.

10. An electrically conductive composite as claimed in claim 1, wherein said dielectric material is a pressure sensitive adhesive.

11. An electrically conductive composite comprising:
a dielectric material having a first side and a second side;
conductive particles within the dielectric material, said conductive particles including a first set of conductive particles that are aligned to form a plurality of conductive paths formed by electrophoresis from the first side to the second side of the dielectric material, each of said conductive paths formed by electrophoresis being formed of at least a plurality of conductive particles, wherein said conductive layer includes conductive carbon; and
a thin film transferred layer of a conductive material on a first side of the dielectric material, said thin film transferred layer having been deposited onto the dielectric material by thin film transfer, wherein the thin film transferred layer facilitates the electronic coupling together of a plurality of the conductive paths from the first side to the second side of the dielectric material, and wherein each of the conductive paths formed by electrophoresis remains formed without requiring any curing of the dielectric material.

12. An electrically conductive composite as claimed in claim 11, wherein said conductive particles include carbon.

13. An electrically conductive composite as claimed in claim 11, wherein said conductive particles include a metal.

14. An electrically conductive composite as claimed in claim 11, wherein said conductive paths are formed by dielectrophoresis.

15. An electrically conductive composite as claimed in claim 11, wherein said conductive layer includes metallic foil.

16. An electrically conductive composite as claimed in claim 11, wherein said dielectric material is a pressure sensitive adhesive.

17. An electrically conductive composite comprising:
a dielectric material having a first side and a second side;
conductive particles within the dielectric material, said conductive particles including a first set of conductive particles that are aligned to form a plurality of conductive paths formed by electrophoresis from the first side to the second side of the dielectric material, each of said conductive paths formed by electrophoresis being formed of at least a plurality of conductive particles, wherein said conductive layer includes conductive carbon; and a printed layer of a conductive material on a first side of the dielectric material, wherein the printed layer facilitates the electronic coupling together of a plurality of the conductive paths from the first side to the second side of the dielectric material, and wherein each of the conductive paths formed by electrophoresis remains formed without requiring any curing of the dielectric material.

18. An electrically conductive composite as claimed in claim 17, wherein said conductive particles include carbon.

19. An electrically conductive composite as claimed in claim 17, wherein said conductive particles include a metal.

20. An electrically conductive composite as claimed in claim 17, wherein said conductive paths are formed by dielectrophoresis.

21. An electrically conductive composite as claimed in claim 17, wherein said conductive layer includes metallic foil.

22. An electrically conductive composite as claimed in claim 17, wherein said dielectric material is a pressure sensitive adhesive.

* * * * *